United States Patent
Higuchi et al.

(10) Patent No.: US 6,512,064 B2
(45) Date of Patent: *Jan. 28, 2003

(54) FLUORORESIN FILM OF HIGH MECHANICAL STRENGTH

(75) Inventors: Yoshiaki Higuchi, Kanagawa (JP); Yukio Jitsugiri, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/986,560

(22) Filed: Nov. 9, 2001

(65) Prior Publication Data

US 2002/0086963 A1 Jul. 4, 2002

(30) Foreign Application Priority Data

Nov. 10, 2000 (JP) ........................................ 2000-343860
Nov. 22, 2000 (JP) ........................................ 2000-355910
Sep. 25, 2001 (JP) ........................................ 2001-290906

(51) Int. Cl.$^7$ ..................... C08F 214/18; C08F 210/02; C08J 5/18
(52) U.S. Cl. ................ 526/250; 264/288.4; 264/290.2; 526/242; 526/348.1
(58) Field of Search ............................... 526/250, 242, 526/348.1; 264/288.4, 290.2

(56) References Cited

U.S. PATENT DOCUMENTS 4,519,969 A * 5/1985 Murakami ............... 264/210.7
4,617,207 A    10/1986 Ueki et al.
4,866,212 A *  9/1989 Ingram ....................... 174/28
6,087,729 A *  7/2000 Cerofolini ................. 257/760

OTHER PUBLICATIONS

Patent Abstracts of Japan, JP 01 198636, Aug. 10, 1989.
Patent Abstracts of Japan, JP 63 243143, Oct. 11, 1988.
Patent Abstracts of Japan, JP 62 299327, Dec. 26, 1987.

* cited by examiner

*Primary Examiner*—Fred Zitomer
(74) *Attorney, Agent, or Firm*—Oblon, Spivak, McClelland, Maier & Neustadt, P.C.

(57) ABSTRACT

A fluororesin film, which has a dielectric constant of at most 5, and which has a tensile break strength of at least 40 MPa in each of MD direction and TD direction; a fluororesin film, wherein the ratio of the tensile break strength in each of MD and TD directions after stretching to the tensile break strength in each of MD and TD directions before stretching, is at least 1.5; and a fluororesin film, which has a tensile modulus of at least 3,000 MPa in each of MD and TD directions. The above-mentioned fluororesin films are obtained by using a method of biaxially stretching laminates of corresponding raw fabric films and readily stretchable films.

5 Claims, 1 Drawing Sheet

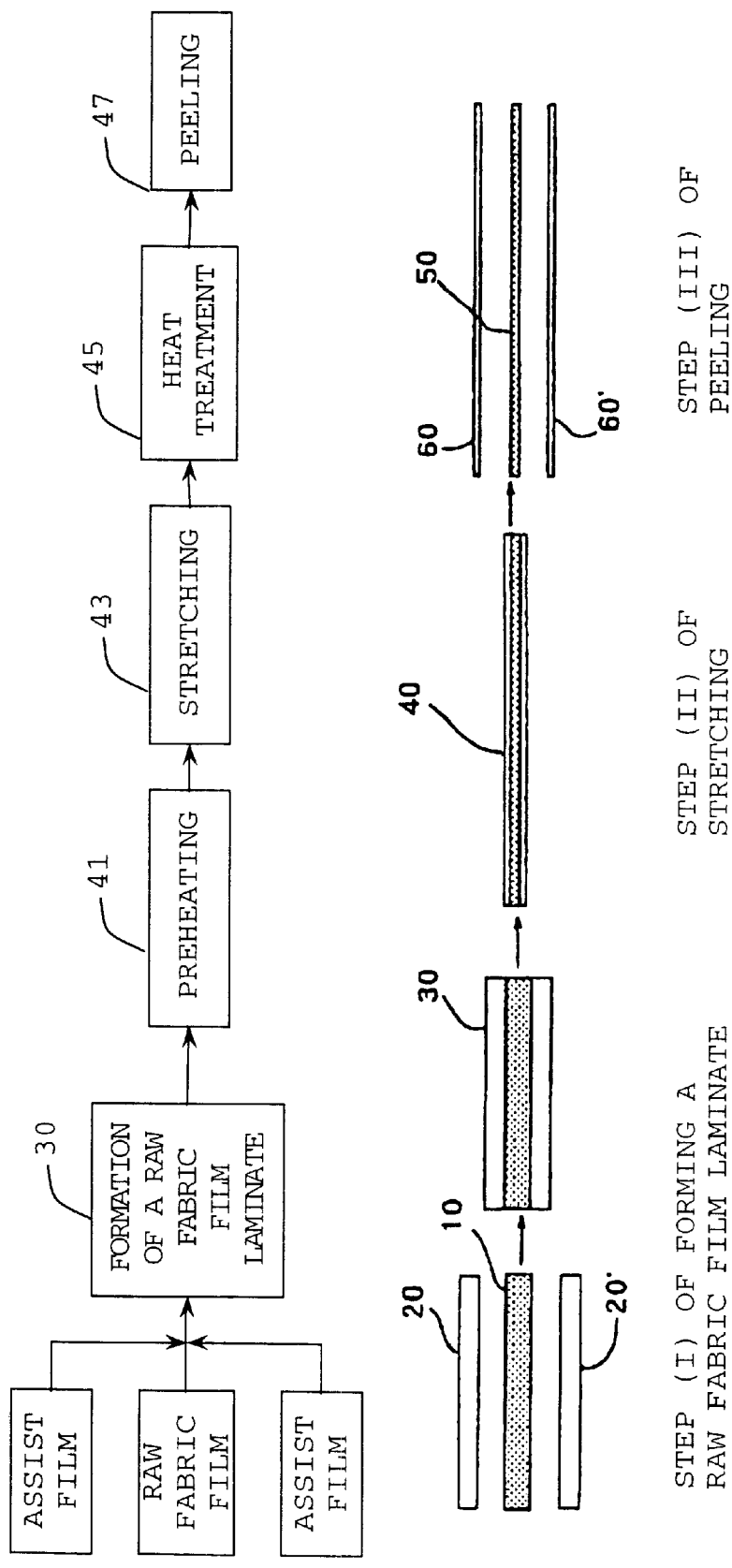

FLUORORESIN FILM OF HIGH MECHANICAL STRENGTH

The present invention relates to a fluororesin film having mechanical strength such as tensile break strength or tensile modulus remarkably improved as compared with conventional films.

A fluororesin film has excellent physical properties which are not observed with other films, in that it has physical and chemical properties such as heat resistance, weather resistance, chemical resistance and non-tackiness basically in good balance. By virtue of such properties, it is used in a wide range of fields including, for example, a film material for laminates, a film material for adhesive tapes, an agricultural covering material for tunnel houses or pipe houses, a film for electrical insulation, a film for packaging, a release film for printed circuit boards, a film for capacitors, a film for surface protection, a protective film for kitchens or kitchen equipments, a gas sampling bag, a protective film for road sound insulating walls, a laminated film as a building material, an inner film for solar collectors, a cover film for fireman's or work clothings, and a surface film for copying boards. However, a fluororesin film is usually not so good with respect to the mechanical properties such as tensile break strength or tensile modulus, as compared with other resin films for industrial use.

If it is possible to substantially improve the mechanical strength such as tensile break strength of a fluororesin film while maintaining the excellent various properties such as heat resistance, the above-mentioned applications, such as an agricultural covering material for tunnel houses or pipe houses, a film for packaging, a film material for laminates, a film material for adhesive tapes, a film for electrical insulation, etc. can be realized by a film substantially thinner than the film presently available, and such is very desirable also from the viewpoint of the weight reduction or resource saving. Further, it is expected that the application of such a fluororesin film will be expanded also to an industrial field where higher strength of a film is required together with the above-mentioned excellent various properties.

A stretching method may be mentioned as one of conventional methods for improving mechanical strength, etc. of a resin film. This is a method to increase the strength or crystallinity of a film by monoaxially or biaxially stretching the film to have molecular chains or crystallites oriented, and such a method is commonly employed in the field of various industrial films. However, in the field of fluororesin films, it is commonly believed that the effect of stretching for improvement of the physical properties is rather low. Further, the stretchability is not good. Accordingly, as a stretched film of a fluororesin, only a polyvinylidene fluoride is practically industrially used at present.

As a result of a detailed study from such a viewpoint by the present inventors, it has been found that a raw fabric of a fluororesin film is certainly basically poor in stretchability, and if it is stretched as it is (hereinafter referred to as simple substance stretching), even if it can be stretched, it can hardly be uniformly stretched, and it is impossible to accomplish improvement of mechanical strength in good balance as the entire film. Further, it has been found very difficult to carry out stretching so that the mechanical strength is balanced in the longitudinal direction and in the transverse direction.

The present inventors have found that if, instead of stretching a fluororesin film alone, such a fluororesin film is sandwiched between readily stretchable films to obtain a laminated film, and such a laminated film is stretched mainly with the readily stretchable films constituting the outer layers, the objective fluororesin film constituting the core layer, will be forcibly stretched as pulled by the readily stretchable films of the outer layers, and consequently, it will be uniformly stretched.

It is an object of the present invention to provide a novel fluororesin film of high strength, which has mechanical strength such as tensile break strength or tensile modulus of the fluororesin film substantially improved, while maintaining various excellent properties such as heat resistance, and which can be prepared by the above-mentioned new stretching principle.

The present invention has been made to solve the above-mentioned problems, and it provides a novel fluororesin film of high strength, which has a dielectric constant of at most 5, and which has a tensile break strength of at least 40 MPa in each of MD direction (longitudinal direction) and TD direction (transverse direction).

Further, the present invention provides a fluororesin film of high strength which is a biaxially stretched film of a fluororesin having a dielectric constant of at most 5, wherein the ratio of the tensile break strength in each of MD and TD directions after stretching to the tensile break strength in each of MD and TD directions before stretching, is at least 1.5.

Still further, the present invention provides a fluororesin film having a high tensile modulus, which has a dielectric constant of at most 5, and which has a tensile modulus of at least 3,000 MPa in each of MD and TD directions.

In the accompanying drawing, FIG. 1 shows a schematic flow chart illustrating the stretching process in the present invention.

Now, the present invention will be described in detail with reference to the preferred embodiments.

The fluororesin film of the present invention is not particularly limited so long as it is a fluororesin film having a dielectric constant of at most 5. For example, the following may be mentioned as preferred materials. Namely, a tetrafluoroethylene type fluororesin such as a tetrafluoroethylene/perfluoro(alkyl vinyl ether) type copolymer (PFA) (wherein the carbon number of the perfluoroalkyl group is preferably from about 1 to 18) or a tetrafluoroethylene/hexafluoropropylene type copolymer (FEP); or a ethylene/tetrafluoroethylene type copolymer (ETFE); or a chlorofluoroethylene type fluororesin such as a polychlorotrifluoroethylene (PCTFE) or an ethylene/chlorotrifluoroethylene type copolymer (ECTFE), may, for example, be mentioned. Further, a blend material of these resins or further copolymers of such monomer components may also be used.

The definition of "a dielectric constant of at most 5" is meant for excluding a fluororesin film of vinylidene fluoride type such as polyvinylidene fluoride (PVDF) (dielectric constant: 10 to 13) or of a vinyl fluoride type such as polyvinyl fluoride (PVF) (dielectric constant: 8 to 9). Namely, PVDF or the like is different in the electrical nature from other fluororesins covered by the present invention, and such a resin can be relatively easily stretched by single substance stretching, whereby a film having a sufficiently high mechanical property such as tensile strength is already available, and there is no substantial practical merit in applying the present invention.

The fluororesin film of the present invention can be obtained by firstly forming a raw fabric film from the above fluororesin and then stretching it under certain specific conditions.

Now, this stretching process will be described with reference to the accompanying drawing. FIG. 1 is a schematic flow chart illustrating this stretching process which essentially comprises a step I of forming a laminate of a raw fabric film and an assist film, a step II of stretching the laminate, and a step III of peeling the assist film after stretching. Here, the reference numerals have the following meanings. 10: a raw fabric film; 20, 20': an assist film; 30: a raw fabric film laminate; 41: a preheating step; 43: a stretching step; 45: a heat treatment step; 47: a step of peeling an assist film; 50: a fluororesin film after stretching; 60, 60': an assist film after stretching.

Firstly, the step I will be described.

The step I is a step of laminating an assist film 20 or 20' to assist stretching, on at least one side, preferably on each side, of a raw fabric film 10 to form a raw fabric film/assist film laminate (hereinafter referred to as a raw fabric film laminate) 30.

The layer structure of the raw fabric film laminate may usually be selected from the following embodiments, wherein the raw fabric film is represented by "T", "T'", "T''" . . . , and the assist film is represented by "A".

| | |
|---|---|
| (1) T/A or A/T | (double layer structure) |
| (2) T/A/T | (three layer structure) |
| (3) A/T/A | (three layer structure) |
| (4) A(T/A/T/A . . . T/A) | (multi-layer structure by repetition of T/A) |
| (5) T(A/T/A/T . . . A/T) | (multi-layer structure by repetition of A/T) |
| (6) A/T/T'/T''/ . . . /A | (here, T/T'/T''/ . . . indicates that the raw fabric film is a multi-layer raw fabric film comprising a plurality of raw fabric films.) |

In the case of (6), the constituting raw fabric films T/T'/T''/ . . . are sufficiently bonded to one another so that they can not be easily peeled at the respective laminated surfaces. For such bonding, a means such as heat fusion by e.g. hot pressing at a high temperature, lamination after activation treatment of the laminating surface by colonna discharge, or bonding by an adhesive, may be employed.

The thickness of the raw fabric film is not particularly limited, but it is usually from about 80 to 1,000 μm, and the thickness of the assist film is usually from about 50 to 600 μm.

It is a point to form the raw fabric film laminate 30 prior to stretching in order to obtain a fluororesin film of high mechanical strength having a tensile break strength higher than a specific value in each of MD and TD directions, or in order to obtain a fluororesin film of high rigidity having a tensile modulus higher than a specific value also in each of MD and TD directions, as intended by the present invention.

Namely, the laminate here is different from a usual laminate and is not intended to form a laminated film as a final product wherein the assist films 20 and 20' are firmly bonded or fused to the raw fabric film 10 as the core layer. The assist film laminated to the core layer may simply be overlaid on the core layer with an interfacial bond strength (or an interfacial shear strength) of a certain degree. Namely, the interfacial bond strength may be a minimum level such that in the subsequent stretching step, when the assist layer forming an outer surface is subjected to stretching as pinched by the stretching apparatus such as rolls, guide rails or clips, the raw fabric film as the core layer may be forced to follow the stretching of the assist layer as the outer layer, without slippage at the interface of the two layers and the two layers of the core layer/the assist layer will not move independently. And, such an assist film is required to be easily peeled from the core layer in the peeling step after the stretching step. Also from this viewpoint, an interfacial bond strength higher than necessary, which makes the peeling difficult, is undesirable.

Formation of such a raw fabric film laminate 30 can be carried out by various methods. For example, (1) a hot lamination method may be employed wherein separately prepared fluororesin raw fabric film 10 and assist films 20 and 20' are overlaid one on another and hot-pressed by a hot press or by passing through heated rolls. Otherwise, (2) a co-extrusion lamination method may be employed wherein a fluororesin and a resin to form assist films are melted in a multi-layer die and extruded in the form of a laminated film. In such a multi-layer die, the position at which the fluororesin film and the assist films are laminated, may be within the die or outside of the die, and in the former case, the structure of the die may be a single manifold or a multi-manifold. Further, it is possible to employ (3) an extrusion lamination method wherein a fluororesin film is preliminarily prepared, and a resin to form an assist film is extruded in a film form on the fluororesin film, followed by press bonding. Further, in the case of the hot pressing by e.g. a hot press, the bond strength may be adjusted by interposing a suitable adhesive such as a hot melt adhesive between the two layers.

In the case of forming a laminated film by the above-mentioned method, it is common to subject the surface of the film as the substrate preliminarily to surface treatment such as corona discharge treatment in order to increase the bond strength between the layers. However, in the raw fabric film laminate in the present invention, the assist film is required to be readily peeled after stretching, and accordingly, no such pretreatment is usually required.

The resin to be used as an assist film in the present invention is selected basically from resin films which can readily be stretched by single substance stretching (more specifically, single substance biaxial stretching) by themselves, and is preferably one having a melting point (mp) or a glass transition point (Tg) lower than the fluororesin film as the core. The resin useful as such an assist film is not particularly limited, and it may, for example, be polyethyleneterephthalate (PET), polypropylene (PP), polyethylene (PE), polycarbonate (PC), nylon 6 (PA6), nylon 66 (PA66), polystyrene (PS), poly a-methylstyrene (PaMS), polyacrylonitrile (PAN), polyvinyl chloride (PVC), polyvinyl acetate (PVAC), polybutene (PB), chlorinated polyethylene (CPE), an ethylene/vinyl chloride copolymer (EVC), an ethylene/vinyl acetate copolymer (EVA), polymethyl methacrylate (PMMA), or polyvinyl alcohol (PVAL). Among them, PET, PP, PE, PC and PA6 are preferred. An assist film prepared by such a resin is preferably a non-stretched film.

The step II is a stretching step for stretching the raw fabric film laminate formed in the step I as described above.

As shown in FIG. 1, the stretching step comprises mainly steps of preheating 41 of the raw fabric film laminate 30 to a stretching temperature, stretching 43 and heat setting (stabilization) by heat treatment 45.

The raw fabric film laminate 30 is firstly preheated to a stretching temperature. As the preheating temperature, a suitable temperature is selected which is higher than the glass transition temperature and lower than the melting point of the fluororesin film as the raw fabric film and the assist film combined therewith. For example, in the case of a combination of a ETFE film as the raw fabric film and a PET film as the assist film, it is about from 80 to 120° C. Further, the preheating can be carried out by contacting the raw fabric film laminate to a heated roll, or by applying hot air or irradiation by e.g. an infrared ray heater.

In the present invention, the stretching is meant for biaxial stretching, and it can be carried out by a method known per se and is not particularly limited. However, it is preferably carried out by simultaneous biaxial stretching or sequential biaxial stretching. Simultaneous biaxial stretching is most preferred.

The simultaneous biaxial stretching is one wherein longitudinal stretching (stretching in the advancing direction of the film (MD direction)) and transverse stretching (stretching in the direction perpendicular to the advancing direction of the film (TD direction)) are carried out simultaneously, and usually, an apparatus which is slightly different in mechanism from one used in the after-mentioned sequential biaxial stretching, is used. Namely, it is basic that while moving the raw fabric film laminate by guide rails, the guide rails are opened by a tenter disposed in a predetermined shape to carry out stretching in a transverse direction, and at the same time, stretching in a longitudinal direction is carried out by clips of a pantagraph mechanism, which expand the distance in a longitudinal direction.

On the other hand, the sequential biaxial stretching is one wherein usually, longitudinal stretching is carried out first, and then transverse stretching is carried out. A typical means for such longitudinal stretching is one employing stretching rolls, wherein a low speed revolving roll is disposed at an upstream side, a high speed revolving roll is disposed at a downstream side, and a preheated raw fabric film laminate is passed through these rolls, whereby a tension is applied in the advancing direction of the film by utilizing the difference in the peripheral speed of the two rolls, and the film is thereby stretched in the longitudinal direction. Then, in the transverse stretching, the film is stretched in a transverse direction by a tenter which is basically the same as mentioned above. In the case of the sequential biaxial stretching, formation of the raw fabric film laminate by overlaying an assist film on a raw fabric film, is carried out basically prior to stretching of the first step (longitudinal stretching). However, in some cases, it may be carried out prior to stretching of the second stage (transverse stretching). For example, in a case where formation of a thin fluororesin film of at most about 10 μm, in order to facilitate peeling of the assist film after stretching, it is possible to select an operation wherein stretching of the first stage is carried out only with respect to the raw fabric film, and only the stretching of the second stage is carried out with respect to a raw fabric film laminate having an assist film overlaid on the raw fabric film. This is based on an experimental discovery by the present inventors that a fluororesin film can be stretched relatively easily and constantly without using an assist film in the case of monoaxial stretching.

Further, the stretching may be carried out not only by so-called flat plate stretching as described above, but also by an inflation method which is carried out in combination with a circular die.

The stretching ratio may vary depending upon the thickness or the type of the raw fabric film or the assist film, the tensile break strength of the intended film, etc. However, it is usually from 2 to 15 times in a longitudinal direction and from 2 to 15 times in a transverse direction. Preferably, it is from 2 to 6 times in a longitudinal direction and from 2 to 6 times in a transverse direction.

The raw fabric film laminate stretched as described above, is preferably subjected to heat treatment at a temperature higher than the stretching temperature to relax the residual stress and to improve the dimensional stability.

Usually, the temperature for the heat treatment is preferably within a range of from the stretching temperature to the melting point of the fluororesin film employed, more preferably within a range of from a temperature higher by 20° C. than the stretching temperature to a temperature lower by about 10° C. than the melting point. Further, the heat treating time is preferably from 0.1 to 60 minutes. For example, in the case of an ETFE film, it is preferred to carry out heat treatment at a temperature of from 140 to 200° C. for from 0.2 to 10 minutes.

Finally, in the step III, (stretched) assist films 60 and 60' are peeled to obtain a fluororesin film 50 having high mechanical strength in both MD and TD directions, of the present invention. The thickness of the fluororesin film after stretching is preferably from 1 to 100 μm.

The fluororesin film of the present invention is a fluororesin film having high tensile break strength. However, it is noteworthy that not only its tensile break strength in each of MD and TD directions is at least 40 MPa, preferably at least 60 MPa, more preferably at least 70 MPa, most preferably at least 80 MPa, but also it is a well balanced film having substantially no difference or extremely small difference in the tensile break strength between in MD direction and in TD direction. Specifically, it is a film whereby the difference in the tensile break strength between in MD direction and in TD direction is at least within 15% of the average value of the tensile break strength in both directions, as shown by the following formula.

$$(|X_{MD}-X_{TD}|/X_{AV}) \leq 0.15 \qquad (1)$$

In the formula (1), $X_{MD}$ and $X_{TD}$ are the tensile break strengths (MPa) in MD and TD directions, respectively, and $X_{AV}$ is an average value of the tensile break strength in MD and TD directions.

In the fluororesin film of the present invention, the difference in the tensile break strength as defined by the formula (1) is more preferably at most 10%, still further preferably at most 5%.

Further, the fluororesin film of the present invention is a fluororesin film of high strength, wherein the ratio (R) of the tensile break strength in each of MD and TD directions after stretching to the tensile break strength in each of MD and TD directions before stretching, is at least 1.5, preferably at least 2.0. In such a case, the fluororesin film is particularly preferably an ETFE film or a FEP film.

Further, the fluororesin film of the present invention is a fluororesin film having a high tensile modulus, and it is noteworthy that not only its tensile modulus in each of MD and TD directions is at least 3,000 MPa, preferably at least 3,500 MPa, more preferably at least 3,900 MPa, but also it is a well balanced film whereby there is no substantial difference or extremely small difference in the tensile modulus between in MD direction and in TD direction. In this specification, the tensile modulus is a value calculated by dividing the stress per unit cross sectional area at a strain of 0.5% in the tensile stress-strain curve obtained by the tensile test of a film as described in Example 3, by the strain. Specifically, it is a film whereby the difference in the tensile modulus between in MD direction and in TD direction is at least within 15% of the average value of the tensile modulus in both directions, as represented by the following formula (2).

$$(|E_{MD}-E_{TD}|/E_{AV}) \leq 0.15 \qquad (2)$$

In the formula (2), $E_{MD}$ and $E_{TD}$ are the tensile modulus (MPa) in MD and TD directions, respectively, and $E_{AV}$ is the average value of the tensile modulus in MD and TD directions.

In the fluororesin film of the present invention, the difference in the tensile modulus as defined by the formula (2) is more preferably at most 10%, still more preferably at most 5%. In such a case, the fluororesin film is particularly preferably an ETFE film.

The fluororesin film of the present invention is a film having a well balanced high tensile break strength and/or high tensile modulus while maintaining excellent physical and chemical properties such as heat resistance, light resistance and chemical resistance, inherent to the fluororesin. Accordingly, it is useful particularly as a film material for a laminate (such as a wall paper, or a desktop mat), a film material for an adhesive tape, a film for electrical insulation, a film for agricultural use or a film for packaging.

Now, the present invention will be described in further detail with reference to Examples. However, it should be understood that the present invention is by no means restricted to such specific Examples.

EXAMPLE 1

(1) ETFE having a melt index (MI) value of 1.5 at 300° C. (AFLON COP (trademark) C-55AX, manufactured by Asahi Glass Company, Limited) was extruded by means of a single screw extruder (VS40, manufactured by Ikegai Co., Ltd.) having an aperture of 40 mm employing a flat die having a mouth piece width of 700 mm at a die temperature of 333° C. at an extrusion rate of 8 kg/hr, to obtain an extruded product. The extruded product was withdrawn along a roll adjusted so that the surface temperature became 130° C., at a speed of 0.59 m/min, to obtain a raw fabric film of ETFE having a thickness of 201 $\mu$m.

(2) The obtained film (hereinafter referred to as the ETFE raw fabric film) was subjected to biaxial stretching by the following method to obtain a test sample for a tensile test.

(a) Namely, firstly, non-stretched polyester films (A-PET FR-1, manufactured by Teijin Co., Ltd.) of 210 $\mu$m, as films to assist stretching, were overlaid on and beneath the ETFE raw fabric film of 201 $\mu$m to obtain a film made of three sheets. Then, using a pair of rolls comprising a metal roll and a roll covered with a rubber having a thickness of 10 mm, after adjusting so that the surface temperature became 85° C., the film made of three sheets, was pressed so that the linear pressure calculated by the width of the film became 40 kg/cm and hot-pressed for lamination at a speed of 10 cm/min to obtain a three layer laminated film. The obtained three layer laminated film (the raw fabric film laminate) was cut into a square of 90×90 mm to obtain a test sample for stretching.

(b) The test sample of this raw fabric film laminate was subjected to simultaneous biaxial stretching by means of a biaxial stretching test apparatus (biaxial stretching test apparatus×6H, manufactured by Toyo Seiki Seisaku-Sho, Ltd.) under such conditions that the temperature was 90° C., preheating was three minutes and the stretching speed was 2 m/min, so that the stretching ratio would be three times in both longitudinal and transverse directions relative to the size of the test sample before stretching, to obtain a biaxially stretched film. The obtained biaxially stretched film was cooled in air under tension until the surface temperature became not higher than 40° C. and then taken out. Then, A-PET films as assist films laminated on and beneath the raw fabric film were peeled to obtain a biaxially stretched ETFE film. The thickness of the biaxially stretched ETFE film was 25 $\mu$m.

(c) In accordance with test standard ASTM-D638, the tensile strength of the obtained biaxially stretched ETFE film was measured. The results are shown in Table 1. Here, MD represents a lengthwise direction (longitudinal direction) at the time of extrusion molding, and TD represents a width direction (transverse direction) at the time of extrusion molding, as mentioned above.

COMPARATIVE EXAMPLE 1

In the same manner as in Example 1 except that the roll speed for withdrawing the extruded products was changed to 5.08 m/min, a non-stretched ETFE film having a thickness of 25 $\mu$m was obtained. The tensile strength was measured in the same manner as in Example 1, and the results are shown in Table 1.

COMPARATIVE EXAMPLE 2

In the same manner as in Example 1 except that the roll speed for withdrawing the extruded product was changed to 1.19 m/min, an ETFE film having a thickness of 100 $\mu$m was obtained. The obtained ETFE film was treated in the same manner as in Example 1 to obtain a three layer laminated film.

Then, the three layer laminated film was stretched four times in a longitudinal direction (MD direction) by means of the same stretching apparatus as used in Example 1 while maintaining it so that the dimension in a transverse direction (TD direction) would not change, and then it was cooled in air under tension until the surface temperature became not higher than 40° C. and then taken out. Then, A-PET films as assist films were peeled to obtain a monoaxially stretched ETFE film. The thickness of the monoaxially stretched ETFE film was 32 $\mu$m. This monoaxially stretched ETFE film was subjected to the measurement of the tensile strength in the same manner as in Example 1, and the results are shown in Table 1.

TABLE 1

|  | Ex. 1 | Comp. Ex. 1 | Comp. Ex. 2 | Break strength ratio (R) |
|---|---|---|---|---|
| Tensile break strength in MD direction (MPa) | 93 | 48 | 132 | 1.9 |
| Tensile break strength in TD direction (MPa) | 94 | 34 | 36 | 2.7 |

EXAMPLE 2

(1) A tetrafluoroethylene/hexafluoropropylene copolymer (FEP, manufactured by Daikin Industries, Ltd.) was extruded by means of a single screw extruder (VS40, manufactured by Ikegai Co., Ltd.) having an aperture of 40 mm employing a flat die having a mouth piece width of 700 mm at a die temperature of 360° C. at an extrusion rate of 4.5 kg/hr, to obtain an extruded product. The extruded product was withdrawn along a roll adjusted so that the surface temperature became 120° C., at a speed of 0.53 m/min, to obtain a raw fabric film having a thickness of 101 $\mu$m.

(2) The obtained film (hereinafter referred to as the FEP raw fabric film) was subjected to biaxial stretching by the following method to obtain a test sample for a tensile test.

(a) Namely, firstly, non-stretched polyester films (A-PET FR-1, manufactured by Teijin Co., Ltd.) as films to assist stretching, were overlaid on and beneath the EFP raw fabric film of 210 μm to obtain a film made of three sheets. Then, using a pair of rolls comprising a metal roll and a roll covered with a rubber having a thickness of 10 mm, after adjusting its surface temperature to 85° C., the above-mentioned film made of three sheets was pressed so that the linear pressure calculated by the width of the film became 40 kg/cm and hot-pressed for lamination at a speed of 10 cm/min to obtain a three layer laminated film. The obtained three layer laminated film (the raw fabric film laminate) was cut into a square of 90×90 mm to obtain a test sample for stretching.

(b) The test sample of this raw fabric film laminate was subjected to simultaneous biaxial stretching by means of a biaxial stretching test apparatus (biaxial stretching test apparatus×6H, manufactured by Toyo Seiki Seisaku-Sho, Ltd.) under such conditions that the temperature was 90° C., preheating was three minutes and the stretching speed was 0.8 m/min, so that the stretching ratio would be two times in each of the longitudinal and transverse directions relative to the size of the test sample before stretching, to obtain a biaxially stretched film. The obtained biaxially stretched film was cooled in air under tension until the surface temperature became not higher than 40° C. and then taken out. Then, A-PET films as assist films laminated on and beneath the raw fabric film were peeled to obtain a biaxially stretched FEP film. The thickness of the biaxially stretched FEP film was 27 μm.

(c) In accordance with test standard ASTM-D638, the tensile strength of the obtained biaxially stretched FEP film was measured. The results are shown in Table 2.

COMPARATIVE EXAMPLE 3

In the same manner as in Example 2 except that the roll speed for withdrawing the extruded products was changed to 2.20 m/min, a non-stretched FEP film having a thickness of 25 μm was obtained. The tensile strength was measured in the same manner as in Example 1, and the results are shown in Table 2.

COMPARATIVE EXAMPLE 4

In the same manner as in Example 2 except that the roll speed for withdrawing the extruded product was changed to 0.91 m/min, a non-stretched FEP film having a thickness of 76 μm was obtained. The obtained non-stretched FEP film was treated in the same manner as in Example 2 to obtain a three layer laminated film.

Then, the three layer laminated film was stretched three times in a longitudinal direction (MD direction) by means of the same stretching apparatus as used in Example 2 while maintaining it so that the dimension in a transverse direction (TD direction) would not change. After cooling in air, A-PET films were peeled to obtain a monoaxially stretched FEP film. The thickness of the monoaxially stretched FEP film was 26 μm. This monoaxially stretched FEP film was subjected to the measurement of the tensile strength in the same manner as in Example 2, and the results are shown in Table 2.

TABLE 2

|  | Ex. 2 | Comp. Ex. 3 | Comp. Ex. 4 | Break strength ratio (R) |
|---|---|---|---|---|
| Tensile break strength in MD direction (MPa) | 41.9 | 17.9 | 55.3 | 2.3 |
| Tensile break strength in TD direction (MPa) | 46.5 | 15.2 | 14.7 | 3.0 |

EXAMPLE 3

(1) An ETFE having a melt index (MI) value of 1.7 at 300° C. (AFLON COP (trademark) C-55AX, manufactured by Asahi Glass Company, Limited) was extruded by means of a single screw extruder (VS40, manufactured by Ikegai Co., Ltd.) having an aperture of 40 mm employing a flat die having a mouth piece width of 700 mm at a die temperature of 300° C. at an extrusion rate of 10 kg/hr, to obtain an extruded product. The extruded product was withdrawn along a roll adjusted so that the surface temperature became 130° C., at a speed of 0.74 m/min, to obtain an ETFE raw fabric film having a thickness of 198 μm.

(2) The obtained ETFE raw fabric film was subjected to biaxial stretching by the following method to obtain a test sample for measuring the tensile modulus.

(a) Namely, firstly, non-stretched polyester films of 210 μm (A-PET FR-1, manufactured by Teijin Co., Ltd.) as films to assist stretching, were overlaid on and beneath the ETFE raw fabric film of 198 μm to obtain a film made of three sheets. Then, using a pair of rolls comprising a metal roll and a roll covered with a rubber having a thickness of 10 mm, after adjusting its surface temperature to 85° C., the above-mentioned film made of three sheets was pressed so that the linear pressure calculated by the width of the film became 40 kg/cm and hot-pressed for lamination at a speed of 10 cm/min to obtain a three layer laminated film. The obtained three layer laminated film (the raw fabric film laminate) was cut into a square of 90×90 mm to obtain a test sample for stretching.

(b) The test sample of this raw fabric film laminate was subjected to simultaneous biaxial stretching by means of a biaxial stretching test apparatus (biaxial stretching test apparatus×6H, manufactured by Toyo Seiki Seisaku-Sho, Ltd.) under such conditions that the temperature was 88° C., preheating was three minutes and the stretching speed was 2 m/min, so that the stretching ratio would be three times in each of the longitudinal and transverse directions relative to the size of the test sample before stretching, to obtain a biaxially stretched film. The obtained biaxially stretched film was cooled in air under tension until the surface temperature became not higher than 40° C. and then taken out. Then, A-PET films as assist films laminated on and beneath the raw fabric film were peeled to obtain a biaxially stretched ETFE film. The thickness of the biaxially stretched TFE film was 25 μm.

(3) The tensile modulus of the obtained biaxially stretched ETFE film was measured by the following method. Namely, from the biaxially stretched ETFE film, a strip shape test sample having a width of 10 mm and a length of 150 mm, was cut out, and both ends of this test sample was fixed by chucks of a tensile strength test apparatus (Tensilon UTM, manufactured by Orientec Co., Ltd.) at a temperature of 23° C. The chuck distance in the lengthwise direction of the strip shape test sample was adjusted to be 100 mm, and a tensile test was carried out at a tensile speed of 50 mm/min to prepare a tensile stress-strain curve. The tensile modulus can usually be calculated by means of the initial linear portion of a tensile stress-strain curve, from its inclination. Here, the tensile modulus was calculated by dividing the stress per unit cross-sectional area at a strain of 0.5% in the obtained stress-strain curve by the strain. The results of the measurements of the tensile modulus are shown in Table 3. Here, MD represents a lengthwise direction (longitudinal direction) at the time of extrusion molding of the film, and TD represents a width direction (a transverse direction) at the time of the extrusion molding, as mentioned above.

COMPARATIVE EXAMPLE 5

In the same manner as in Example 3 except that the roll speed for withdrawing the extruded product was changed to 6.51 m/min, a non-stretched ETFE film having a thickness of 25 μm was obtained. The tensile modulus was measured in the same manner as in Example 3, and the results are shown in Table 3.

COMPARATIVE EXAMPLE 6

In the same manner as in Example 3 except that the roll speed for withdrawing the extruded product was changed to 1.49 m/min, an ETFE film having a thickness of 100 μm was obtained. The obtained ETFE film was treated in the same manner as in Example 3 to obtain a three layer laminated film.

Then, the three layer laminated film was stretched five times in a longitudinal direction (MD direction) while maintaining it so that the dimension in a transverse direction (TD direction) would not change, by means of the same stretching apparatus as used in Example 3, and it was cooled by air under tension until the surface temperature became not higher than 40° C. and then taken out. Then, A-PET films as assist films were peeled to obtain a monoaxially stretched ETFE film. The thickness of the monoaxially stretched ETFE film was 26 μm. This monoaxially stretched ETFE film was subjected to the measurement of the tensile modulus in the same manner as in Example 3, and the results are shown in Table 3.

TABLE 3

|  | Ex. 3 | Comp. Ex. 5 | Comp. Ex. 6 |
| --- | --- | --- | --- |
| Tensile modulus in MD direction (MPa) | 4018 | 1960 | 6468 |
| Tensile modulus in TD direction (MPa) | 3969 | 1862 | 1313 |

From Tables 1 and 2, it is evident that the films of Examples 1 and 2 are biaxially stretched films obtained by the assist method and the tensile break strength in each of MD and TD directions is at least 40 MPa in each case. Thus, it is evident that they are novel fluororesin films satisfying the requirements defined by the present invention. Further, the ETFE film of Comparative Example 1 is a conventional fluororesin film having a low tensile break strength, and with the monoaxially stretched film by the assist method in Comparative Example 2, the tensile break strength in MD direction is as large as 132 MPa, but the tensile break strength in non-stretched TD direction naturally remains to be low without any substantial change. Further, the FEP film of Comparative Example 3 is a conventional fluororesin film having a low tensile break strength, and with the monoaxially stretched film by the assist method in Comparative Example 4, the tensile break strength in MD direction is as high as 55.3 MPa, but the tensile break strength in non-stretched TD direction naturally rather tends to be low at a level of 14.7 MPa.

Further, as is evident from the results in Examples 1 and 2, with the fluororesin films of the present invention, not only that the tensile break strength in each of MD and TD directions is at least 40 MPa, but also there is no substantial difference in strength between in MD direction and in TD direction, as shown in Example 1 (ETFE) wherein the tensile break strength is 93 MPa in MD direction and 94 MPa in TD direction (here, the difference in strength is about 1%). Further, in the case of Example 2 (FEP), the tensile break strength is 41.9 MPa in MD direction and 46.5 MPa in TD direction, and thus, there is no substantial difference in the strength between in MD direction and in TD direction (here, the difference in strength is about 10%).

This is a characteristic which is advantageous when the fluororesin film of the present invention is used for e.g. a packaging material.

Further, the films of the present invention in Examples 1 and 2 are fluororesin films, wherein the ratio (R) of the tensile break strength in each of MD and TD directions after stretching to the tensile break strength in each of MD and TD directions before stretching, is at least 1.5, preferably at least 2.0, in each case (in the case of ETFE in Example 1, R is 1.9 in MD direction and 2.4 in TD direction, and in the case of FEP in Example 2, R is 2.3 in MD direction and 3.0 in TD direction).

Further, it is evident from Table 3 that the biaxially stretched film in Example 3 is a biaxially stretched film by the assist method, but the tensile modulus in each of MD and TD directions is at least 3,000 MPa. It is evident that it is a novel fluororesin film satisfying the requirements defined by the present invention. Further, the film in Comparative Example 5 is a conventional fluororesin film having a low tensile modulus, and with the monoaxially stretched film by the assist method in Comparative Example 6, the tensile modulus in MD direction is as high as 6,468 MPa, but the tensile modulus in non-stretched TD direction is lower than before stretching.

Further, it is evident from the results in Example 3 that with the fluororesin film of the present invention, not only the tensile modulus in each of MD and TD direction is at least 3,000 MPa, but also there is no substantial difference in the tensile modulus between in MD direction and in TD direction, i.e. 4,018 MPa in MD direction, and 3,969 MPa in TD direction (here, the difference in the tensile modulus is about 1.2%, as calculated by the formula (2)). This is considered to be a characteristic which is advantageous when the fluororesin film of the present invention is used for e.g. a film material for a laminate or a film material for an adhesive tape.

The entire disclosures of Japanese Patent Application No. 2000-343860 filed on Nov. 10, 2000, Japanese Patent Application No. 2000-355910 filed on Nov. 22, 2000 and Japanese Patent Application No. 2001-290906 filed on Sep. 25, 2001 including specifications, claims, drawings and summaries are incorporated herein by reference in their entireties.

What is claimed is:

1. A biaxially stretched fluororesin film of high strength, which has a dielectric constant of at most 5, and which has a tensile break strength of at least 40 MPa in each of MD and TD directions, wherein the biaxially stretched film is a film obtained by a method comprising a step I of forming a laminate of a raw fabric film and an assist film, a step II of stretching the laminate, and a step III of peeling the assist film after stretching.

2. The film according to claim 1, wherein the laminate of the raw fabric film and the assist film, is formed by a hot lamination method wherein the raw fabric film and the assist film are overlaid one on another and hot-pressed by a hot press or by passing through heated rolls.

3. The film according to claim 1, wherein the laminate of the raw fabric film and the assist film has a three layer structure of assist film/raw fabric film/assist film.

4. The film according to claim 1, wherein the assist film is made of polyethylene terephthalate, polypropylene, polyethylene, polycarbonate or nylon 6.

5. The film according to claim 1, wherein the stretching ratio of the laminate of the raw fabric film and the assist film in the step II is from 2 to 12 times in the longitudinal direction and from 2 to 12 times in the transverse direction.

* * * * *